United States Patent
Funakoshi et al.

(10) Patent No.: US 8,717,105 B2
(45) Date of Patent: May 6, 2014

(54) AMPLIFIER CIRCUIT, INTEGRATING CIRCUIT, AND LIGHT-DETECTION DEVICE

(75) Inventors: Haruhiro Funakoshi, Hamamatsu (JP); Shinya Ito, Hamamatsu (JP)

(73) Assignee: Hamamatsu Photonics K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 13/379,126

(22) PCT Filed: Jun. 10, 2010

(86) PCT No.: PCT/JP2010/059838
§ 371 (c)(1),
(2), (4) Date: Feb. 10, 2012

(87) PCT Pub. No.: WO2010/150658
PCT Pub. Date: Dec. 29, 2010

(65) Prior Publication Data
US 2013/0038393 A1 Feb. 14, 2013

(30) Foreign Application Priority Data
Jun. 22, 2009 (JP) .................................. 2009 147620

(51) Int. Cl.
*H03F 3/08* (2006.01)
(52) U.S. Cl.
USPC .......................................... 330/308; 330/307
(58) Field of Classification Search
USPC .............. 330/253, 255, 307, 308; 250/214 A, 250/214 AG
See application file for complete search history.

(56) References Cited

U.S. PATENT DOCUMENTS

| | | | |
|---|---|---|---|
| 4,988,954 A | 1/1991 | Stern et al. | |
| 5,363,059 A * | 11/1994 | Thiel | 330/253 |
| 5,399,992 A | 3/1995 | Itakura et al. | |
| 6,326,847 B1 * | 12/2001 | Xu | 330/253 |
| 7,683,307 B2 * | 3/2010 | Kawaguchi et al. | 250/214 A |
| 7,764,121 B2 * | 7/2010 | An et al. | 330/255 |
| 2005/0199813 A1 | 9/2005 | Van Bogget | |
| 2007/0024367 A1 * | 2/2007 | Oyama | 330/255 |
| 2007/0096819 A1 * | 5/2007 | Yamamoto et al. | 330/255 |

FOREIGN PATENT DOCUMENTS

| | | |
|---|---|---|
| CN | 1428932 | 7/2003 |
| JP | 2-305007 | 12/1990 |
| JP | 4-356816 | 12/1992 |
| JP | 6-105067 | 4/1994 |
| JP | 2006-505975 | 2/2006 |
| JP | 2008-092272 | 4/2008 |

* cited by examiner

*Primary Examiner* — Khanh V Nguyen
(74) *Attorney, Agent, or Firm* — Drinker Biddle & Reath LLP

(57) ABSTRACT

A photodetecting device 1 includes a photodiode PD and an integrating circuit 11. The integrating circuit 11 includes an amplifier circuit 20, a capacitive element $C_2$, and a second switch $SW_2$. The amplifier circuit 20 has a driving section including a PMOS transistor $T_1$ and an NMOS transistor $T_2$, the respective drain terminals thereof being connected to each other. A first switch $SW_1$ comprising a PMOS transistor $T_{10}$ is opened or closed according to the level of a first reset signal Reset1 input to the gate terminal. When the first reset signal Reset1 is at a low level, the first switch $SW_1$ is closed to apply a power supply potential VDD to the gate terminal of the PMOS transistor $T_1$, thereby turning off the PMOS transistor $T_1$. Thus, an amplifier circuit, an integrating circuit and a photodetecting device capable of achieving both low power consumption and high speed can be realized.

3 Claims, 5 Drawing Sheets

AMPLIFIER CIRCUIT, INTEGRATING CIRCUIT, AND LIGHT-DETECTION DEVICE

TECHNICAL FIELD

The present invention relates to an integrating circuit which accumulates an input electric charge and outputs a voltage value according to the amount of accumulated electric charge, to a photodetecting device including the integrating circuit and a photodiode, and to an amplifier circuit included in the integrating circuit.

BACKGROUND ART

As the photodetecting device, the one including a photodiode and an integrating circuit is known (for example, see Patent Document 1). This integrating circuit includes an amplifier circuit having a first input terminal, a second input terminal, and an output terminal; and a capacitive element and a switch provided between the first input terminal and the output terminal of the amplifier circuit, the capacitive element and the switch being connected in parallel to each other. In this photodetecting device, the switch of the integrating circuit is closed so that the capacitive element in the integrating circuit is discharged, and the voltage value output from the integrating circuit is initialized. When the switch of the integrating circuit is opened, an electric charge generated in the photodiode is accumulated in the capacitive element of the integrating circuit, and a voltage value according to the amount of accumulated electric charge is output from the integrating circuit. Further, if the photodetecting device includes a plurality of photodiodes arranged in one dimension or in two dimensions, it is possible to obtain an optical image in one dimension or in two dimensions.

CITATION LIST

Patent Literature

Patent Document 1: Japanese Patent Application Laid-Open No. H06-105067

SUMMARY OF INVENTION

Technical Problem

In the photodetecting device, there is a need to increase the number of photodiodes arranged, and accordingly, there is also a need to achieve high speed and low power consumption. However, an attempt to reduce the power consumption of the integrating circuit included in the photodetecting device results in a lowering of the drive capability of the amplifier circuit, so that the time required for the output voltage value of the integrating circuit to be initialized by closing the switch of the integrating circuit will increase. That is, conventionally, it is difficult to achieve both low power consumption and high speed.

The present invention has been made in order to solve the above-described problem, and has an object to provide an amplifier circuit, an integrating circuit, and a photodetecting device capable of achieving both low power consumption and high speed.

Solution to Problem

An amplifier circuit according to the present invention has a first input terminal, a second input terminal, and an output terminal, and the amplifier circuit includes (1) a driving section including a PMOS transistor and an NMOS transistor, respective drain terminals thereof being connected to each other, wherein this connection point is connected to the output terminal, and (2) a first switch provided between a first reference potential input terminal to which a first reference potential is input and a gate terminal of the PMOS transistor, the first switch turning off the PMOS transistor by applying the first reference potential to the gate terminal of the PMOS transistor. Note that, of the first input terminal and the second input terminal of the amplifier circuit, one is an inverting input terminal and the other is a non-inverting input terminal.

An integrating circuit according to the present invention includes (1) the amplifier circuit according to the above-described invention, (2) a capacitive element provided between the first input terminal and the output terminal of the amplifier circuit, and (3) a second switch provided in parallel to the capacitive element between the first input terminal and the output terminal of the amplifier circuit. Preferably, the above-described integrating circuit further includes a third switch provided between a second reference potential input terminal to which a second reference potential is input and one terminal of the capacitive element, the third switch applying the second reference potential to the one terminal of the capacitive element.

A photodetecting device according to the present invention includes (1) the integrating circuit according to the above-described invention, and (2) a photodiode which generates an amount of electric charge according to an amount of incident light and causes the generated electric charge to enter the first input terminal of the amplifier circuit in the integrating circuit.

In the present invention, when the second switch is closed in the integrating circuit to discharge the capacitive element and initialize the output voltage value of the integrating circuit, the first switch included in the amplifier circuit is also closed to apply the first reference potential to the gate terminal of the PMOS transistor constituting the driving section of the amplifier circuit and turn off the PMOS transistor. Further, the third switch is also closed to apply the second reference potential to the first input terminal of the amplifier circuit. Thus, the capacitive element in the integrating circuit is quickly discharged.

Advantageous Effects of Invention

According to the present invention, it is possible to achieve both low power consumption and high speed.

DESCRIPTION OF EMBODIMENTS

Hereinafter, with reference to the accompanying drawings, embodiments of the present invention will be described in detail. In the description of the drawings, the same components are denoted by the same reference symbols, and overlapping description will be omitted.

(First Embodiment)

Figure 1:
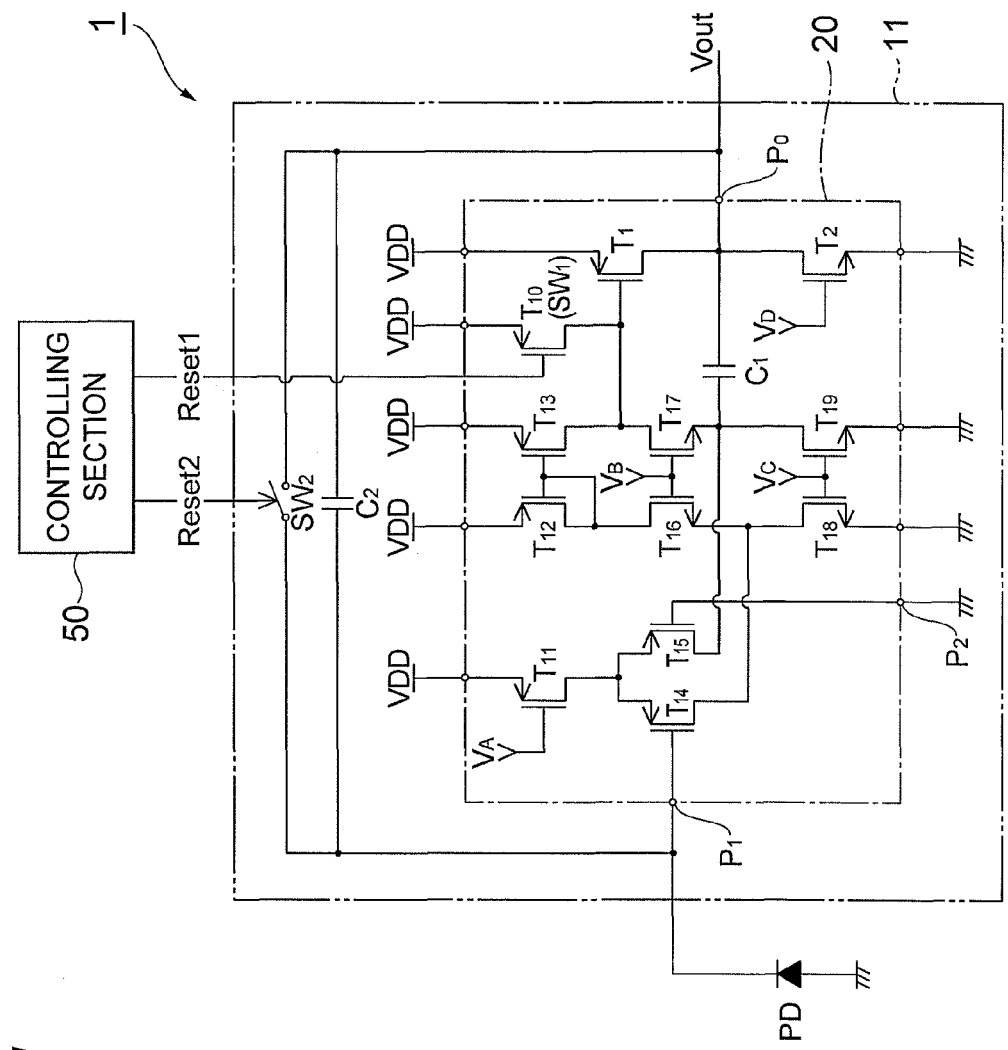
FIG. 1 is a view showing a configuration of a photodetecting device 1 according to a first embodiment.

FIG. 1 is a view showing a configuration of a photodetecting device 1 according to a first embodiment. The photodetecting device 1 shown in this figure includes a photodiode PD and an integrating circuit 11. The integrating circuit 11 includes an amplifier circuit 20, a capacitive element $C_2$, and a second switch $SW_2$.

The amplifier circuit 20 has an inverting input terminal $P_1$, a non-inverting input terminal $P_2$, and an output terminal $P_0$. The capacitive element $C_2$ is provided between the inverting input terminal $P_1$ and the output terminal $P_0$ of the amplifier circuit 20. The second switch $SW_2$ is provided in parallel to the capacitive element $C_2$ between the inverting input terminal $P_1$ and the output terminal $P_0$ of the amplifier circuit 20, and is opened or closed according to the level of a second reset signal Reset2. The non-inverting input terminal $P_2$ of the amplifier circuit 20 is connected to a ground potential. Note that, the non-inverting input terminal $P_2$ of the amplifier circuit 20 is not necessarily connected to the ground potential, but may be connected to a potential of 0.1 V or the like, for example, as long as it is connected to a fixed potential.

The photodiode PD has a cathode terminal and an anode terminal, and generates an amount of electric charge according to an amount of incident light. The cathode terminal of the photodiode PD is connected to the inverting input terminal $P_1$ of the amplifier circuit 20. The anode terminal of the photodiode PD is connected to the ground potential.

The amplifier circuit 20 has a driving section including a PMOS transistor $T_1$ and an NMOS transistor $T_2$, the respective drain terminals thereof being connected to each other, wherein this connection point is connected to the output terminal $P_0$. The source terminal of the PMOS transistor $T_1$ is connected to a power supply potential VDD. The source terminal of the NMOS transistor $T_2$ is connected to the ground potential. A predetermined DC voltage value $V_D$ is input to the gate terminal of the NMOS transistor $T_2$.

Furthermore, the amplifier circuit 20 includes PMOS transistors $T_{10}$ to $T_{15}$, NMOS transistors $T_{16}$ to $T_{19}$, and a capacitive element $C_1$.

The source terminal of the PMOS transistor $T_{11}$ is connected to the power supply potential VDD. A Predetermined DC voltage value $V_A$ is input to the gate terminal of the PMOS transistor $T_{11}$. The drain terminal of the PMOS transistor $T_{11}$ is connected to the respective source terminals of the PMOS transistors $T_{14}$ and $T_{15}$.

The source terminal of the PMOS transistor $T_{12}$ is connected to the power supply potential VDD. The gate terminal of the PMOS transistor $T_{12}$ is connected to the gate terminal of the NMOS transistor $T_{13}$ and the drain terminal thereof. The drain terminal of the PMOS transistor $T_{12}$ is connected to the drain terminal of the NMOS transistor $T_{16}$.

The source terminal of the PMOS transistor $T_{13}$ is connected to the power supply potential VDD. The drain terminal of the PMOS transistor $T_{13}$ is connected to the gate terminal of the PMOS transistor $T_1$ and the drain terminal of the NMOS transistor $T_{17}$.

The PMOS transistor $T_{14}$ and the PMOS transistor $T_{15}$ constitute a differential pair input section in the amplifier circuit 20.

The gate terminal of the PMOS transistor $T_{14}$ is connected to the inverting input terminal $P_1$ of the amplifier circuit 20. The drain terminal of the PMOS transistor $T_{14}$ is connected to the source terminal of the NMOS transistor $T_{16}$ and the drain terminal of the NMOS transistor $T_{18}$.

The gate terminal of the PMOS transistor $T_{15}$ is connected to the non-inverting input terminal $P_2$ of the amplifier circuit 20. The drain terminal of the PMOS transistor $T_{15}$ is connected to the source terminal of the NMOS transistor $T_{17}$ and the drain terminal of the NMOS transistor $T_{19}$, and is also connected to the output terminal $P_0$ via the capacitive element $C_1$.

The source terminal of the NMOS transistor $T_{16}$ is connected to the drain terminal of the NMOS transistor $T_{18}$. The source terminal of the NMOS transistor $T_{17}$ is connected to the drain terminal of the NMOS transistor $T_{19}$. A predetermined DC voltage value $V_B$ is input to the respective gate terminals of the NMOS transistor $T_{16}$ and the NMOS transistor $T_{17}$.

The respective source terminals of the NMOS transistor $T_{18}$ and the NMOS transistor $T_{19}$ are connected to the ground potential. A predetermined DC voltage value $V_C$ is input to the respective gate terminals of the NMOS transistor $T_{18}$ and the NMOS transistor $T_{19}$.

The PMOS transistor $T_{10}$ functions as a first switch $SW_1$ capable of turning of the PMOS transistor $T_1$ by applying the power supply potential VDD to the gate terminal of the PMOS transistor $T_1$. The first switch $SW_1$ comprising the PMOS transistor $T_{10}$ is provided between a power supply potential input terminal to which the power supply potential VDD is input and the gate terminal of the PMOS transistor $T_1$.

The source terminal of the PMOS transistor $T_{10}$ is connected to the power supply potential input terminal to which the power supply potential VDD is input. The drain terminal of the PMOS transistor $T_{10}$ is connected to the gate terminal of the MOS transistor $T_1$. Moreover, a first reset signal Reset1 is input to the gate terminal of the PMOS transistor $T_{10}$.

The first switch $SW_1$ configured by the PMOS transistor $T_{10}$ is opened or closed according to the level of the first reset signal Reset1 input to the gate terminal. That is, when the first reset signal Reset1 is at a high level, the first switch $SW_1$ configured by the PMOS transistor $T_{10}$ is opened. When the first reset signal Reset1 is at a low level, the first switch $SW_1$ configured by the PMOS transistor $T_{10}$ is closed to apply the power supply potential VDD to the gate terminal of the PMOS transistor $T_1$, thereby turning off the PMOS transistor $T_1$.

Figure 2:
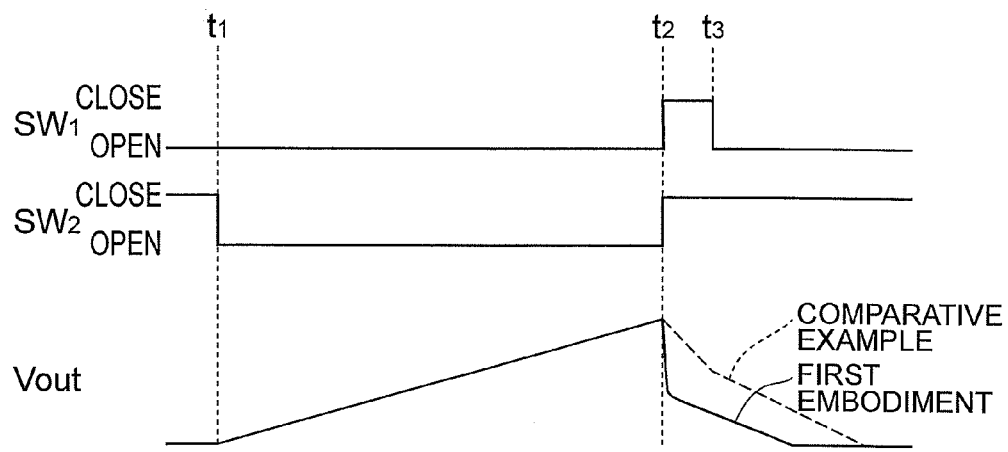
FIG. 2 is a view illustrating an operation of the photodetecting device 1 according to the first embodiment.

The photodetecting device 1 according to the first embodiment includes a controlling section 50 controlling the respective open/close operations of the first switch $SW_1$ and the second switch $SW_2$, and operates as follows under the control of this controlling section. FIG. 2 is a view illustrating an operation of the photodetecting device 1 according to the first embodiment. This figure shows, in order from the top, the open/close state of the first switch $SW_1$, the open/close state of the second switch $SW_2$, and an output voltage value Vout of the photodetecting device 1.

Before the time $t_1$, the first switch $SW_1$ comprising the PMOS transistor $T_{10}$ is opened. Moreover, before the time $t_1$, the second switch $SW_2$ is closed, the capacitive element $C_2$ is discharged, and the output voltage value Vout of the photodetecting device 1 is set to an initial value. At the time $t_1$, the second switch $SW_2$ switches from a close state to an open state.

During a period from the time $t_1$ to the time $t_2$, the first switch $SW_1$ configured by the PMOS transistor $T_{10}$ is opened and the second switch $SW_2$ is also opened. During this period, the integrating circuit 11 inputs an electric charge generated in the photodiode PD to the inverting input terminal $P_1$, accumulates the input electric charge into the capacitive element $C_2$, and outputs the voltage value Vout according to the amount of accumulated electric charge. Accordingly, the output voltage value Vout of the photodetecting device 1 gradually increases with time.

At the time $t_2$, the first switch $SW_1$ configured by the PMOS transistor $T_{10}$ switches from the open state to the close state, and the second switch $SW_2$ also switches from the open state to the close state. At the time $t_2$ and thereafter, the capacitive element $C_2$ continues to be discharged and the output voltage value Vout of the photodetecting device 1 will be set to the initial value. At the subsequent time $t_3$, the first switch $SW_1$ configured by the PMOS transistor $T_{10}$ switches to the open state.

In FIG. 2, the output voltage value Vout of the photodetecting device 1 at the time $t_2$ and thereafter is indicated by a solid line for the present embodiment, while it is indicated by a dashed line for a comparative example. In the comparative example, the first switch $SW_1$ comprising the PMOS transistor $T_{10}$ is not provided.

According to a simulation, in the comparative example in which the first switch $SW_1$ is not provided, the time required for the output voltage value Vout of the photodetecting device at the time $t_2$ and thereafter to reach the initial value is approximately 3.8 µs. In contrast, in the present embodiment in which the first switch $SW_1$ is provided, the time required for the output voltage value Vout of the photodetecting device 1 at the time $t_2$ and thereafter to reach the initial value is approximately 2.1 µs.

In this manner, in the present embodiment, at the time $t_2$, the second switch $SW_2$ switches to the close state and the first switch $SW_1$ also switches to the close state, so that the time required for the output voltage value Vout to reach the initial value is shortened and high speed can be achieved.

The reason why the initialization leads to high speed in the present embodiment is as follows. That is, if at the time $t_2$, the second switch $SW_2$ switches to the close state and the first switch $SW_1$ also switches to the close state, then the power supply potential VDD is applied to the gate terminal of the PMOS transistor $T_1$ constituting the driving section to turn off the PMOS transistor $T_1$, so that a current will not flow between the source terminal and the drain terminal of the MOS transistor $T_1$. On the other hand, the current flowing in the NMOS transistor $T_2$ constituting the driving section does not vary.

Accordingly, the electric charge accumulated in the capacitive element $C_2$ until the time $t_2$ efficiently flows through the NMOS transistor $T_2$, so that the capacitive element $C_2$ is quickly discharged. Generally, an attempt to achieve low power consumption makes it difficult to achieve high speed, but in the present embodiment, the provision of the first switch $SW_1$ makes it possible to achieve both low power consumption and high speed.

(Second Embodiment)

Figure 3:
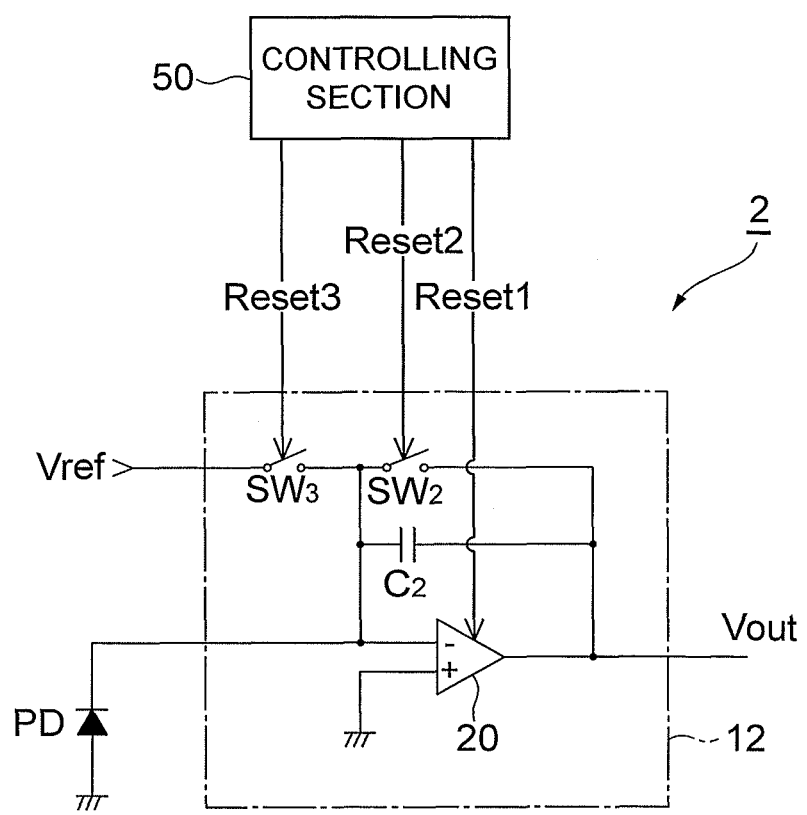
FIG. 3 is a view showing a configuration of a photodetecting device 2 according to a second embodiment.

FIG. 3 is a view showing a configuration of a photodetecting device 2 according to a second embodiment. The photodetecting device 2 shown in this figure includes the photodiode PD and an integrating circuit 12. The integrating circuit 12 includes the amplifier circuit 20, the capacitive element $C_2$, the second switch $SW_2$, and a third switch $SW_3$. Note that, in this FIG. 3, the amplifier circuit 20 is represented by one symbol.

As compared with the configuration of the photodetecting device 1 according to the first embodiment shown in FIG. 1, the photodetecting device 2 according to the second embodiment shown in FIG. 3 differs in that it further includes the third switch $SW_3$. The third switch $SW_3$ is provided between a reference potential input terminal to which a reference potential Vref is input and one terminal (a terminal on the inverting input terminal $P_1$ side of the amplifier circuit 20) of the capacitive element $C_2$, and is opened or closed according to the level of a third reset signal Reset3 and is capable of applying the reference potential Vref to the one terminal of the capacitive element $C_2$. The reference potential Vref may be the ground potential.

Figure 4:
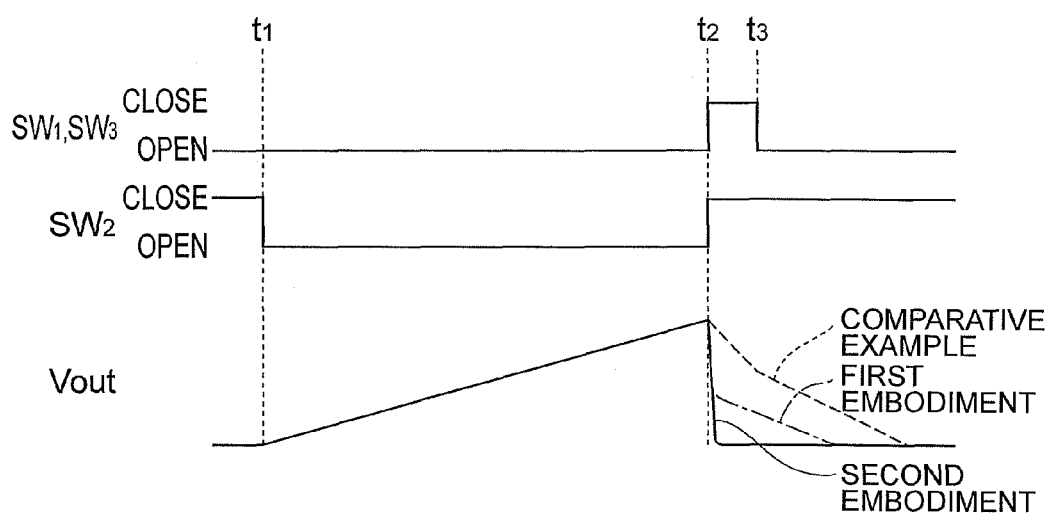
FIG. 4 is a view illustrating an operation of the photodetecting device 2 according to the second embodiment.

The photodetecting device 2 according to the second embodiment includes the controlling section 50 controlling the respective open/close operations of the first switch $SW_1$, the second switch $SW_2$, and the third switch $SW_3$, and operates as follows under the control of this controlling section. FIG. 4 is a view illustrating an operation of the photodetecting device 2 according to the second embodiment. This figure shows, in order from the top, the open/close states of the first switch $SW_1$ and the third switch $SW_3$, the open/close state of the second switch $SW_2$, and the output voltage value Vout of the photodetecting device 2.

Before the time $t_1$, the first switch $SW_1$ and the third switch $SW_3$ are opened. Moreover, before the time $t_1$, the second switch $SW_2$ is closed, the capacitive element $C_2$ is discharged, and the output voltage value Vout of the photodetecting device 2 is set to an initial value. At the time $t_1$, the second switch $SW_2$ switches from a close state to an open state.

During the period from the time $t_1$ to the time $t_2$, the first switch $SW_1$, the second switch $SW_2$, and the third switch $SW_3$ are opened, respectively. During this period, the integrating circuit 12 inputs an electric charge generated in the photodiode PD to the inverting input terminal $P_1$, accumulates the input electric charge into the capacitive element $C_2$, and outputs the voltage value Vout according to the amount of accumulated electric charge. Accordingly, the output voltage value Vout of the photodetecting device 2 gradually increases with time.

At the time $t_2$, the first switch $SW_1$, the second switch $SW_2$, and the third switch $SW_3$ switch from the open state to the close state, respectively. At the time $t_2$ and thereafter, the capacitive element $C_2$ continues to be discharged and the output voltage value Vout of the photodetecting device 2 will be set to the initial value. At the subsequent time $t_3$, the first switch $SW_1$ and the third switch $SW_3$ switch to the open state.

In FIG. 4, the output voltage value Vout of the photodetecting device 2 at the time $t_2$ and thereafter is indicated by a solid line for the second embodiment, while it is indicated by a dot-dashed line for the first embodiment, and is indicated by a dashed line for the comparative example. In the comparative example, neither the first switch $SW_1$ nor the third switch $SW_3$ is provided.

According to a simulation, in the comparative example in which the first switch $SW_1$ and the third switch $SW_3$ are not provided, the time required for the output voltage value Vout of the photodetecting device at the time $t_2$ and thereafter to reach the initial value is approximately 3.8 µs. In the first embodiment in which only the first switch $SW_1$ is provided, the time required for the output voltage value Vout of the photo detecting device 1 at the time $t_2$ and thereafter to reach the initial value is approximately 2.1 µs. In contrast, in the second embodiment in which both the first switch $SW_1$ and the third switch $SW_3$ are provided, the time required for the output voltage value Vout of the photodetecting device 2 at the time $t_2$ and thereafter to reach the initial value is approximately 0.1 µs.

In this manner, in the second embodiment, at the time $t_2$, the second switch $SW_2$ switches to the close state and the first switch $SW_1$ and the third switch $SW_3$ also switch to the close state, so that the time required for the output voltage value Vout to reach the initial value is shortened further and higher speed can be achieved.

The reason why the initialization leads to higher speed in the second embodiment is as follows. That is, if at the time $t_2$, the second switch $SW_2$ switches to the close state and the first switch $SW_1$ also switches to the close state, then the power supply potential VDD is applied to the gate terminal of the PMOS transistor $T_1$ constituting the driving section to turn off the PMOS transistor $T_1$, so that a current will not flow between the source terminal and the drain terminal of the MOS transistor $T_1$. On the other hand, the current flowing in the NMOS transistor $T_2$ constituting the driving section does not vary. Accordingly, the electric charge accumulated in the capacitive element $C_2$ until the time $t_2$ efficiently flows through the NMOS transistor $T_2$. Moreover, in the second embodiment, at the time $t_2$, the third switch $SW_3$ also switches to the close state. Accordingly, the electric charge accumulated in the capacitive element $C_2$ until the time $t_2$ flows also through the third switch $SW_3$.

In this manner, in the second embodiment, the electric charge accumulated in the capacitive element $C_2$ until the time $t_2$ efficiently flows not only through the NMOS transistor $T_2$, but also through the third switch $SW_3$, so that the capacitive element $C_2$ is more quickly discharged. Generally, an attempt to achieve low power consumption makes it difficult to achieve high speed, but in the second embodiment, the provision of the first switch $SW_1$ and the third switch $SW_3$ makes it possible to achieve both low power consumption and high speed.

Figure 5:
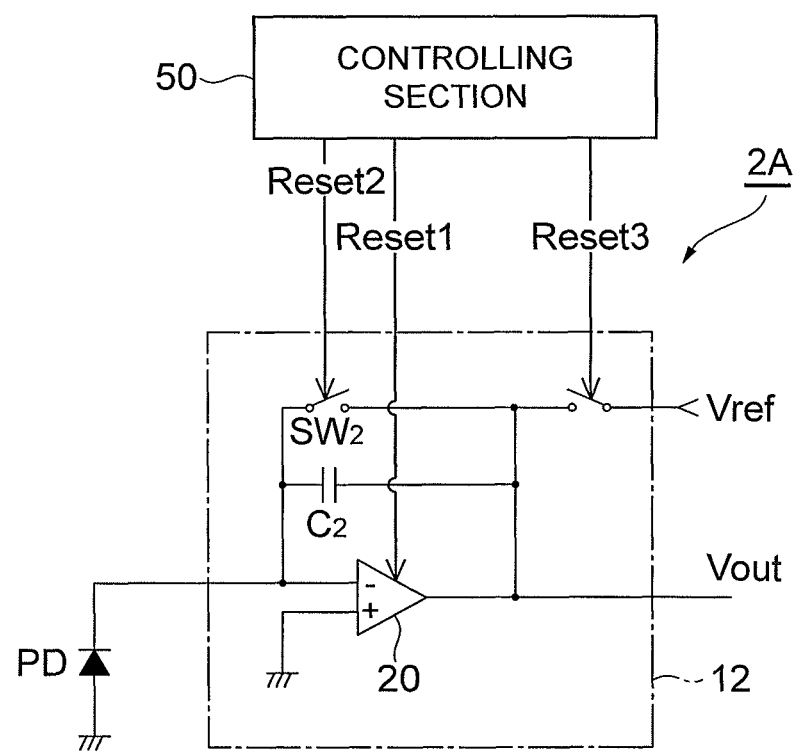
FIG. 5 is a view showing a configuration of a photodetecting device 2A according to a modified example of the second embodiment.

Note that, in the photodetecting device 2 according to the second embodiment, the third switch $SW_3$ is provided between the reference potential input terminal to which the reference potential Vref is input and the one terminal of the capacitive element $C_2$ on the inverting input terminal side of the amplifier circuit 20, but as with a photodetecting device 2A shown in FIG. 5, the third switch $SW_3$ may be provided between the reference potential input terminal to which the reference potential Vref is input and one terminal of the capacitive element $C_2$ on the output terminal side of the amplifier circuit 20. The photodetecting device 2A also operates as with the photodetecting device 2 and can attain the same effect as that of the photodetecting device 2.

INDUSTRIAL APPLICABILITY

The present invention can be used as an amplifier circuit, an integrating circuit, and a photodetecting device capable of achieving both low power consumption and high speed.

REFERENCE SIGNS LIST 1, 2, 2A—photodetecting device, 11, 12—integrating circuit, 20—amplifier circuit, $SW_1$—first switch, $SW_2$—second switch, $SW_3$—third switch, $C_1$, $C_2$—capacitive element, PD—photodiode, $T_1$, $T_{10}$ to $T_{15}$—PMOS transistor, $T_2$, $T_{16}$ to $T_{19}$—NMOS transistor, 50—controlling section.

The invention claimed is:

1. An integrating circuit, comprising:
an amplifier circuit having a first input terminal, a second input terminal, and an output terminal;
a capacitive element provided between the first input terminal and the output terminal of the amplifier circuit; and
a second switch provided in parallel to the capacitive element between the first input terminal and the output terminal of the amplifier circuit, wherein
the amplifier circuit comprises:
a driving section including a PMOS transistor and an NMOS transistor, respective drain terminals thereof being connected to each other, wherein this connection point is connected to the output terminal; and
a first switch provided between a first reference potential input terminal to which a first reference potential is input and a gate terminal of the PMOS transistor, the first switch turning off the PMOS transistor by applying the first reference potential to the gate terminal of the PMOS transistor.

2. The integrating circuit according to claim 1, further comprising a third switch provided between a second reference potential input terminal to which a second reference potential is input and one terminal of the capacitive element, the third switch applying the second reference potential to the one terminal of the capacitive element.

3. A photodetecting device, comprising:
the integrating circuit according to claim 1; and
a photodiode which generates an amount of electric charge according to an amount of incident light and causes the generated electric charge to enter the first input terminal of the amplifier circuit in the integrating circuit.

* * * * *